United States Patent [19]

Wagner et al.

[11] Patent Number: 4,717,872
[45] Date of Patent: Jan. 5, 1988

[54] DEVICE FOR MONITORING CONSUMPTION OF ELECTRICAL POWER

[75] Inventors: Charles G. Wagner, Milton; John S. Ferguson, Georgetown, both of Del.

[73] Assignee: Watt Watcher Inc., Milton, Del.

[21] Appl. No.: 858,128

[22] Filed: May 1, 1986

Related U.S. Application Data

[63] Continuation of Ser. No. 695,293, Jan. 28, 1985, abandoned, which is a continuation of Ser. No. 413,747, Sep. 1, 1982, abandoned.

[51] Int. Cl.⁴ .................. G01R 21/00; G01R 21/08
[52] U.S. Cl. ........................ 324/127; 324/117 H; 336/176
[58] Field of Search ............ 324/117 R, 117 H, 127, 324/157, 129; 336/96, 175, 176

[56] References Cited

U.S. PATENT DOCUMENTS

| | | | |
|---|---|---|---|
| 750,525 | 1/1904 | Everest | 336/176 |
| 2,953,757 | 9/1960 | Yarrick et al. | 336/175 |
| 3,056,922 | 10/1962 | Du Vall et al. | 324/127 |
| 3,323,056 | 5/1967 | Haley | 324/117 R |
| 3,984,798 | 10/1976 | Bussen | 324/127 |
| 4,005,380 | 1/1977 | Heilmann et al. | 336/176 |
| 4,160,950 | 7/1979 | Houldsworth | 324/117 H |
| 4,286,213 | 8/1981 | Fowler | |
| 4,314,200 | 2/1982 | Marek | 324/127 |
| 4,401,943 | 8/1983 | Morris | 324/157 |
| 4,518,913 | 5/1985 | Jackson | 324/117 H |

FOREIGN PATENT DOCUMENTS

| | | | |
|---|---|---|---|
| 1550613 | 11/1968 | France | 324/127 |
| 0099479 | 8/1979 | Japan | 324/117 H |

Primary Examiner—Gerard R. Strecker
Assistant Examiner—W. Burns
Attorney, Agent, or Firm—Sachs & Sachs

[57] ABSTRACT

To enable a user to conveniently determine the amount of AC electrical power supplied by a cable assembly being consumed by appliances at any time, and to thereby enable control of power consumption, a meter indicating power consumption is installed at a convenient remote location and is wired to a sensing unit which is applied externally to the supply cable assembly. No penetration of or other physical connection with cable conductors is necessitated. An induction type sensor or Hall effect sensor may be utilized. The device is applicable to residential, commercial and industrial user/applications and may be built in or portable.

11 Claims, 9 Drawing Figures

DEVICE FOR MONITORING CONSUMPTION OF ELECTRICAL POWER

This application is a continuation of application Ser No. 695,293, filed Jan. 28, 1985, now abandoned, which was a continuation of application Ser. No. 413,747, filed Sept. 1, 1982, now abandoned.

BACKGROUND OF THE INVENTION

The principal object of the present invention is to satisfy a need for a convenient and economical device to enable users to monitor, and thus gain control over, the amount of AC electrical power being consumed by appliances at any given time.

Without such a monitoring means, the user is apt to leave the premises with a number of electrical appliances turned on, which could or should be turned off during the user's absence. A safety or fire hazard can sometimes be created when heavy current-consuming appliances are left unattended.

At the present time, no ready economical means is available for power consumption monitoring without utilizing relatively expensive instrumentation, including means to penetrate or otherwise make contact with the conductors of power supply cable, which is impractical and in some cases illegal.

While certain snap-on meters are known in the prior art which do not require penetration of a cable sheath, these devices are not operable with the multiple (two or three) conductor power supply cables presently in wide use.

The essence of the present invention therefore resides in the provision of a non-penetrating, externally applied sensing unit particularly constructed to coact with AC power supply cables, by electromagnetic induction, or as a Hall effect sensor. An AC signal from the sensor is converted in a 2 volt AC meter which can be read in kilowatt equivalents.

The device is based on the following principles:

(1) The concentric magnetic field around any conductor is directly proportional to the current flowing in the conductor.

(2) Magnetic fields around parallel supply conductors are in opposing relationship, thus creating elliptical fields where the major elliptical axes are across the axes of the parallel conductors.

(3) Lines of magnetic flux cutting across a conductor will induce current flow in that conductor. A similar effect can be obtained by the placement of a Hall effect sensor in the flux field generated by a conductor.

An object of the invention is to provide a device of the above-mentioned type for monitoring power consumption in the home or elsewhere which, except for the sensor, can be constructed from commercially available economical components, thus enabling the manufacturing and sale of the device at relatively low cost.

Another object is to provide a device of the mentioned typed which is entirely practical and reliable.

Other objects and advantages of the invention will become apparent during the course of the following detailed description.

DETAILED DESCRIPTION

The device shown and described herein is a current measuring device calibrated for power. As used herein, the term "power" is employed in the sense that the average household consumer of electrical power uses and understands the term.

Figure 4:
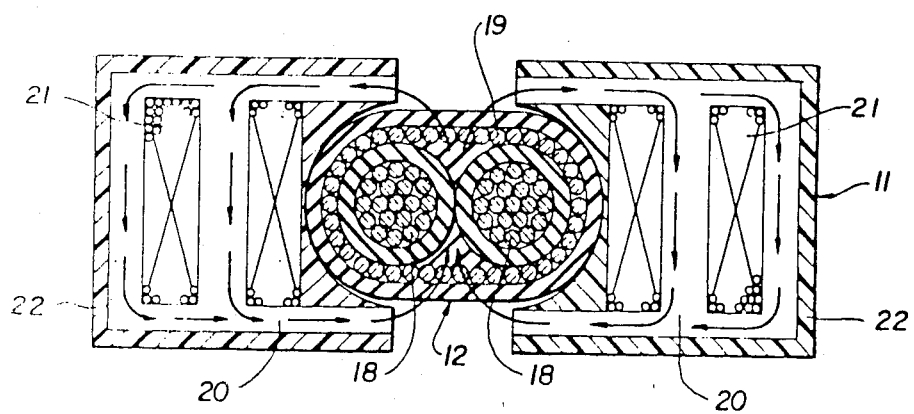
FIG. 4 is an enlarged cross sectional view of an induction sensor according to the invention applied externally to the SE/USE cable.
Figure 5:
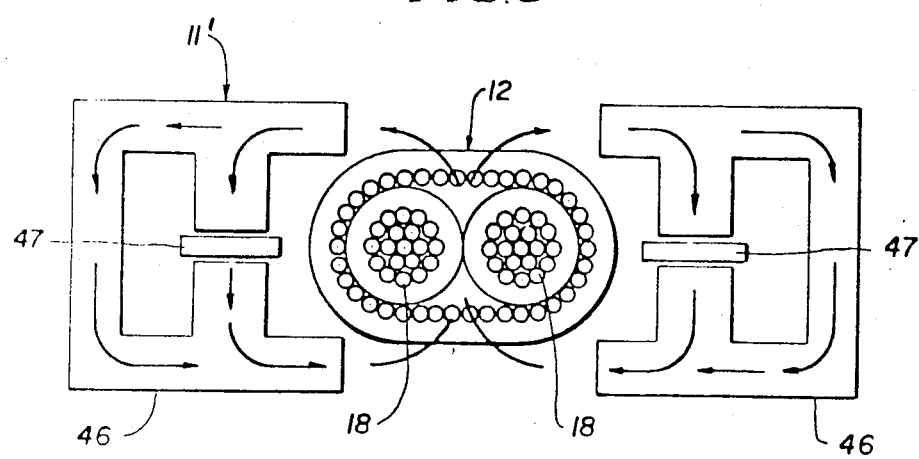
FIG. 5 is a similar view of a Hall effect sensor applied to the calbe.

Referring to the drawings in detail wherein like numerals designate like parts, an electrical power consumption monitoring device comprises essentially two main components, namely a commercial digital voltmeter 10 which can be read in kilowatt equivalents and a sensor unit 11, FIG. 4, or 11', FIG. 5, which can be applied externally to a multiple conductor power supply cable 12.

Figure 7:
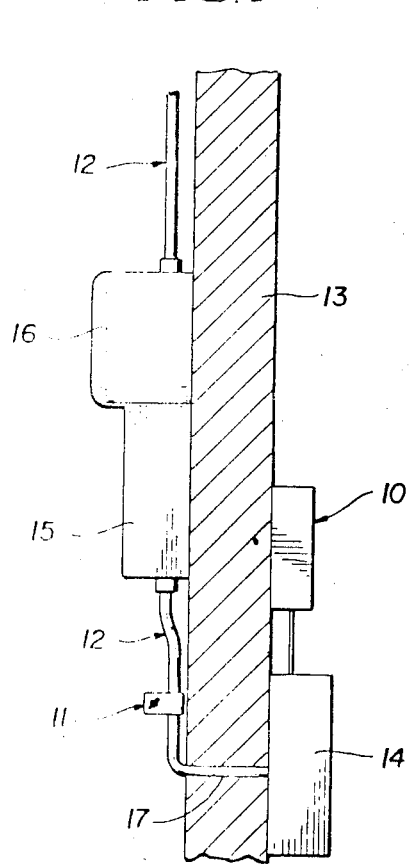
FIG. 7 is a fragmentary vertical cross section taken through the wall of a building on which the invention is installed.

FIG. 7 shows a typical installation of the monitoring device, wherein the numeral 13 designates a building wall on the interior of which is mounted the customary circuit breaker or fuse box 14. An exteriorly mounted junction box 15 and watt hour meter 16, supplied by the power company, are connected in the power supply cable 12 which may pass through the building wall 13 as indicated at 17 for suitable connection with the box 14. As illustrated, the sensor 11 (see FIG. 1, 2, 3, and 4) is mounted externally on the power supply cable 12 between the meter 16 and the point where the cable enters the building. It should be understood, however, that the sensor can be applied to the cable 12 at any convenient point outside or inside of the building where the cable is exposed, and in this sense the invention is not limited to the particular arrangement shown in FIG. 7. The power consumption indicating meter 10 is installed at any convenient location within the building, as on the wall 13, or elsewhere if preferred.

It should also be understood that in some cases the invention including the sensor 11 and meter or read-out device 10 may be completely portable, whereby a user can apply the sensor 11 to the cable 12 at any point while reading the portable meter. Furthermore, the sensor 11 of the portable unit may be integrated with the meter in some cases to monitor any AC power consuming device having a two or three conductor power supply cable.

Figure 1:
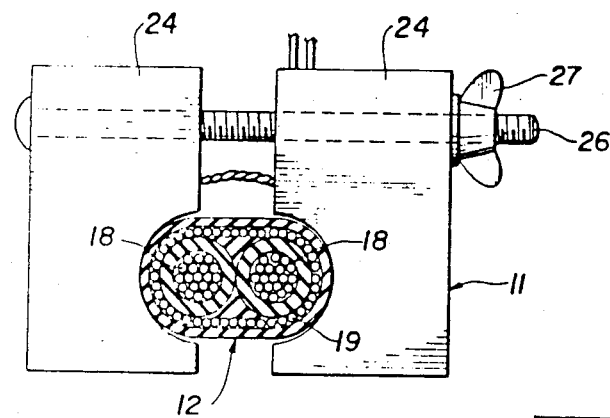
FIG. 1 is a plan view of an externally applied non-penetrating sensing unit in association with a conventional SE/USE power supply cable, the cable being shown in cross section.
Figure 2:
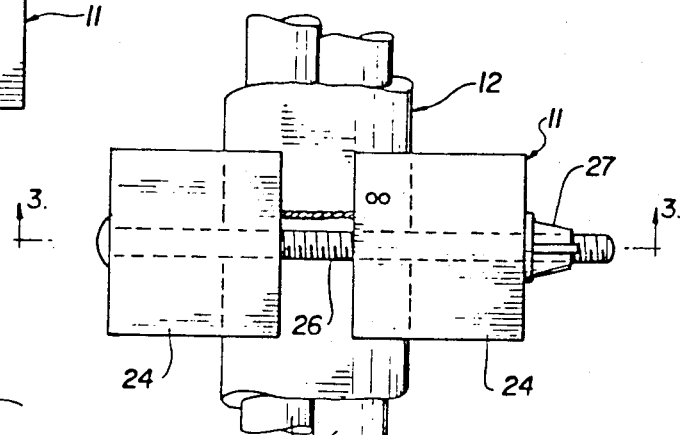
FIG. 2 is a side elevation of the sensing unit.
Figure 3:
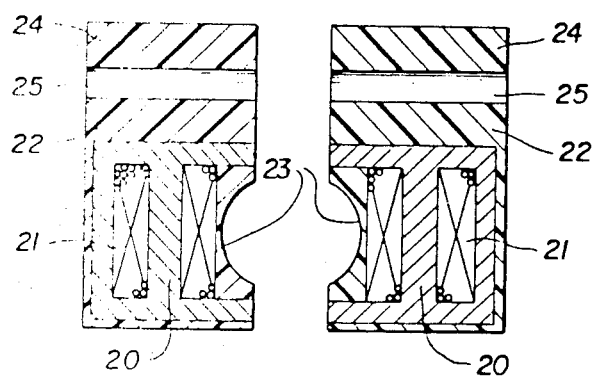
FIG. 3 is a horizontal section taken on line 3—3 of FIG. 2 with parts omitted.
Figure 8:
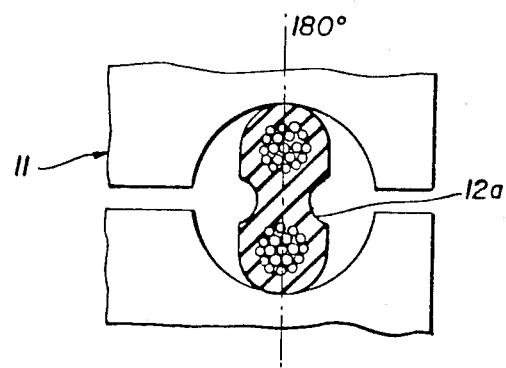
FIGS. 8 and 9 are schematic views of other two and three conductor cables with which the power consumption monitor can be used.
Figure 9:
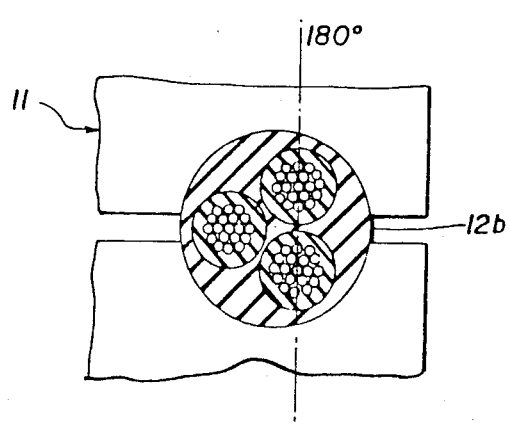

The illustrated cable 12, in FIG. 1, typically a SE/USE power supply cable commonly in wide usage, comprises two side-by-side parallel conductors 18 surrounded by spirally wrapped shielding conductors 19 which carry the neutral or imbalanced remainder of the current. In this invention, the imbalance is negated from the high supply side and added to the low supply side in terms of flux induced voltage. The cable 12 which has a suitable insulating sheath is generally elliptical in cross section. The invention may also be used with non-shielded two and three conductor cables 12a and 12b of the types illustrated in FIGS. 8 and 9. To allow maximum readings on the meter 10, the cables 12a and 12b should be oriented relative to the sensor 11, as shown in FIGS. 8 and 9.

The heart of the invention resides in the induction or Hall effect sensor 11 or 11' (FIGS. 1, 2, 3, and 4). The sensor 11, which utilizes the induction effect in its operation, comprises two identical opposing laminated iron cores 20 placed 180° apart in the plane common to the parallel conductors 18. Each iron core is wrapped with a multi-turn coil 21 of conducting wire and each iron core with its coil is encapsulated in epoxy 22 or equivalent non-conducting and non-magnetic material. The epoxy encapsulation is recessed as at 23 to snugly engage the opposite sides of the cable 12 when the sensor is applied thereto. Bosses 24 are molded on the encapsulating material and these bosses have aligned openings 25 receiving a clamping bolt 26 carrying a winged nut 27, whereby the two cores 20 and their encapsulated coils 21 can be clampingly engaged with opposite sides of the cable 12 without any penetration of the cable sheath and without establishing a physical connection with the two conductor branches 18.

Figure 6:
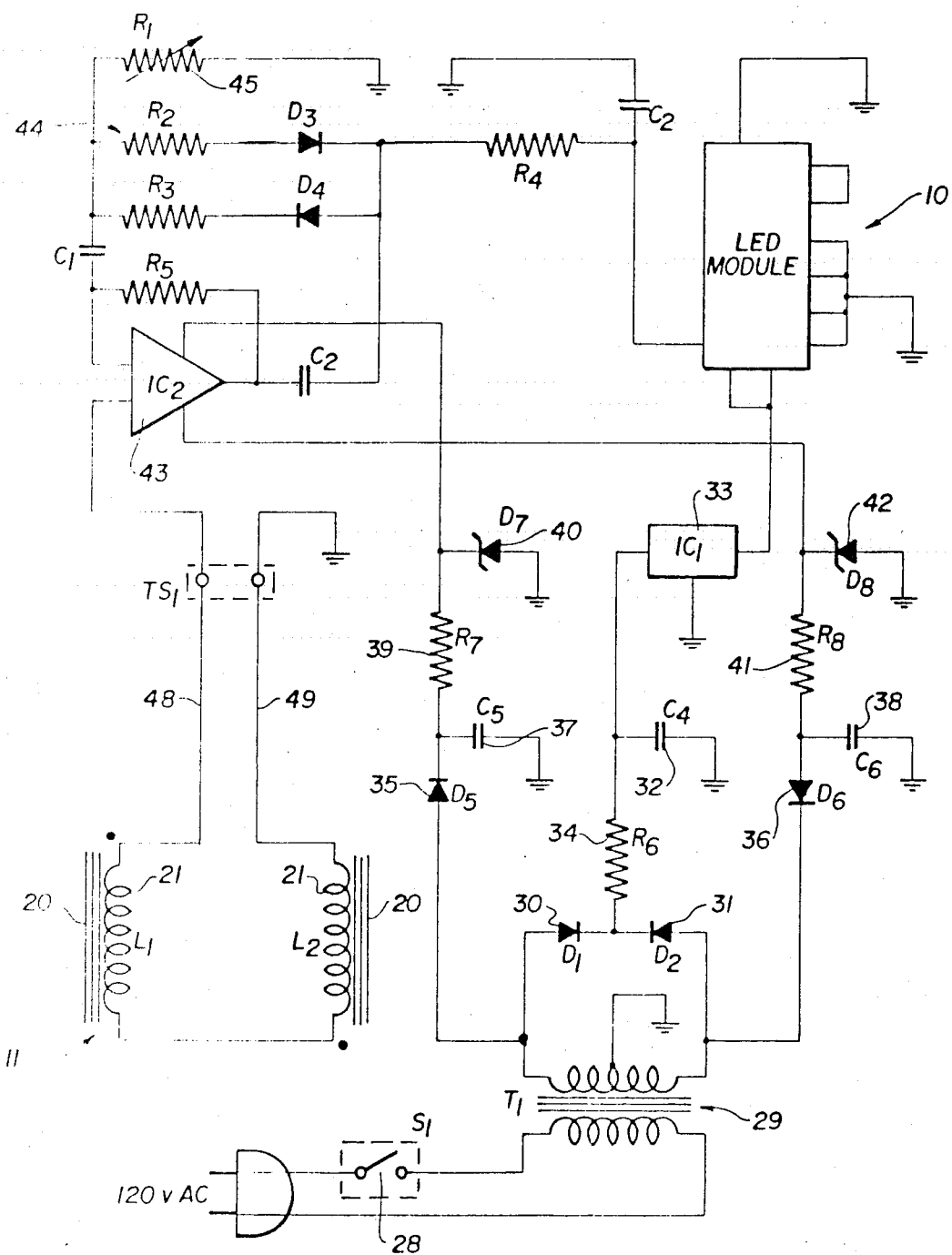
FIG. 6 is a schematic view of circuitry involved in the device.

As shown in FIG. 6, the two induction coils 21 are electrically connected in series aiding relationship, whereby the total voltage signal produced by the coils is sent to the meter or read-out device 10.

Additionally, as shown in FIG. 6, 120 volts AC is applied through on-off switch 28 to transformer 29. A conventional center tapped full wave rectifier using diodes 30 and 31 provides pulsating DC to filter capacitor 32 and 5 volt regulator 33. Regulated 5 volts DC is supplied to DC meter 10. Resistor 34 is used to limit dissipation in regulator 33 and provides surge protection for diodes 30 and 31.

Diodes 35 and 36 are connected as conventional half wave rectifiers for positive and negative voltage output and capacitors 37 and 38 are filter capacitors. Resistance 39 and diode 40 form a conventional zener regulator circuit for +15 volts DC regulator 33, and resistor 41 and diode 42 form a similar regulator circuit for −15 volts DC.

The ±15 volts supplies provide operating voltages for integrated circuit module 43, and operational amplifier working in conjunction with associated components to provide RMS to DC conversion in the converter circuit 44. Potentiometer 45 is for calibration adjustment.

Due to the elliptical fields of flux generated around parallel conductors 18, FIG. 4, the two iron cores 20 collect and channel the bulk of the magnetic flux through the cores, which induces an AC voltage in the two coils 21 in direct proportion to the current flowing in the parallel conductors 18, the coils 21 being connected in series aiding relationship. This voltage is delivered to the converter 44, as described.

In an alternate embodiment of the invention shown in FIG. 5, the sensor 11' is a Hall effect sensor instead of an induction sensor and the induction coils 21 are omitted. In lieu thereof, two laminated iron cores 46 are placed relative to the cable assembly 12 in the same manner previously described, namely, 180° apart in a plane passing through the axes of the two parallel cable conductors 18. Two Hall effect devices 47 are placed within gaps of the two iron cores 46 with their output terminals connected to the wires 48 and 49, FIG. 6. The system operates with the Hall effect devices in the identical manner that it operates with the two induction coils, with relation to the cable assembly 12. The Hall effect devices 47 are of a type manufactured by Ohio Semitronics, Inc., 1205 Chesapeake Ave., Columbus, Ohio 43212, Model No. HP 316 or equivalent devices.

In either embodiment of the invention, it is only necessary to apply the sensor 11 or 11' externally to the cable assembly 12, as shown in the drawings, and to close the switch 28 to activate the power supply. The AC signal from the sensor 11 or 11' is instantly converted to a DC signal in the RMS to DC converter 44, which signal is read in kilowatt equivalents on the DC meter 10.

A homeowner or other user of the invention, by simply reading the meter 10, can determine at any time whether a normal consumption of power is occurring or whether abnormal consumption is taking place. A normal reading on the meter 10 may be 2 or 3, and an excessive reading may be anything above this normal. If an excessive reading is observed on the meter, the user can take corrective steps as by shutting down high energy appliances.

It is to be understood that the forms of the invention herewith shown and described are to be taken as preferred example of the same, and that various changes in the shape, size and arrangement of parts may be resorted to, without departing from the spirit of the invention or scope of the subjoined claims.

We claim:

1. A device for monitoring power consumption where A.C. current at a predetermined voltage is supplied through an insulated cable assembly having at least one pair of insulated parallel conductors occupying a common plane, comprising:
    (a) means for simultaneously sensing current flowing in said pair of parallel conductors, said current sensing means including;
        (i) two separate spaced opposing cores of high magnetic permeability disposed in said common plane on opposite sides of said parallel pair of conductors in close non-penetrating relationship thereto, and
        (ii) an air space provided between said magnetic cores adapted to receive the insulated diameter of said pair of parallel conductors therebetween; and
    (b) read-out instrument means calibrated in units of power being consumed at any given time coupled to said current sensing means; and
    (c) means for powering said read-out instrument means.

2. A device for monitoring power consumption as defined in claim 1 wherein said sensing means includes two induction coils wound on said two cores.

3. A device for monitoring power consumption as defined in claim 1 wherein said sensing means comprises two Hall effect elements, one element disposed in an air gap provided in each said cores.

4. A device for monitoring power consumption as defined in claim 1 further including separable mechanical connector means for engaging said two cores and securing them to said pair of parallel conductors of said cable assembly.

5. A device for monitoring power consumption as defined in claim 4, further including electrically insulating encapsulating means, said two cores being separately encapsulated with said encapsulating means being shaped to conform with the cross section of said pair of parallel conductors of said cable assembly at its opposite sides.

6. A device for monitoring power consumption as defined in claim 1 wherein said read-out instrument means comprises a voltmeter calibrated in power equivalents.

7. A device which enables a consumer to monitor consumption of AC electrical power by appliances which draw current from a cable assembly having two parallel conductors lying in a common plane and being enclosed within an insulation sheath, comprising:
   (a) a pair of separately formed magnetically permeable cores disposed about said common plane in spaced opposing relationship on opposite sides of said cable assembly;
   (b) mechanical means detachably connecting said cores in clamping engagement with the opposite sides of the cable assembly;
   (c) an electrical sensing means disposed on each of said cores for generating an electrical signal voltage in direct proportion to said current flowing in said parallel conductors;
   (d) read-out instrument means calibrated in units of power being consumed by said electrical appliances at any given time; and
   (e) means for powering said read-out instrument means.

8. A device which enables a consumer to monitor the consumption of electrical power by appliances as defined in claim 7, wherein said electrical sensing means comprises a pair of induction coils which are connected in series aiding relationship.

9. An A.C. current sensing device for use on an insulated cable assembly having at least one pair of insulated parallel conductors occupying a common plane, comprising:
   (a) means for simultaneously sensing current flowing in said two parallel conductors, said current sensing means including;
      (i) two separate spaced opposing cores of high magnetic permeability disposed in said common plane on opposite sides of said parallel conductors in close non-penetrating relationship thereto, and
      (ii) an air space provide between said magnetic cores adapted to receive the insulated diameter of said pair of parallel conductors therebetween.

10. A device for monitoring power consumption as defined in claim 1, further including electrically insulating encapsulating means, said two cores being separately encapsulated with said encapsulating material being shaped to conform with the cross section of said pair of parallel conductors of said cable assembly at its opposite sides.

11. An A.C. current sensing device for sensing A.C. current flowing in a cable assembly having two parallel conductors lying in a common plane and being enclosed within an insulation sheath, comprising:
   (a) a pair of separately formed magnetically permeable cores disposed about said common plane in spaced opposing relationship on opposite sides of said cable assembly;
   (b) mechanical means detachably connecting said cores in clamping engagement with the opposite sides of said cable assembly;
   (c) an electrical sensing means disposed on each of said cores for generating an electrical signal voltage in direct proportion to said current flowing in said cable assembly.

* * * * *